(12) United States Patent
Inami

(10) Patent No.: US 7,641,734 B2
(45) Date of Patent: Jan. 5, 2010

(54) METHOD FOR PRODUCING SILICON SINGLE CRYSTAL

(75) Inventor: Shuichi Inami, Tokyo (JP)

(73) Assignee: Sumco Corporation, Tokyo (JP)

( * ) Notice: Subject to any disclaimer, the term of this patent is extended or adjusted under 35 U.S.C. 154(b) by 3 days.

(21) Appl. No.: 12/078,645

(22) Filed: Apr. 2, 2008

(65) Prior Publication Data

US 2008/0245291 A1   Oct. 9, 2008

(30) Foreign Application Priority Data

Apr. 3, 2007   (JP) ............................... 2007-097838

(51) Int. Cl.
*C30B 15/20* (2006.01)

(52) U.S. Cl. .............................. 117/19; 117/13; 117/20; 423/328.2

(58) Field of Classification Search .................... 117/13, 117/19, 20; 423/328.2
See application file for complete search history.

(56) References Cited

U.S. PATENT DOCUMENTS 5,177,569 A * 1/1993 Koyama et al. ............. 257/412
5,221,630 A * 6/1993 Koyama et al. ............. 438/302

FOREIGN PATENT DOCUMENTS

| JP | 4-139092 | 5/1992 |
| JP | 9-249492 | 9/1997 |
| JP | 3555081 | 5/2004 |
| JP | 3726847 | 10/2005 |

\* cited by examiner

*Primary Examiner*—Felisa C Hiteshew
(74) *Attorney, Agent, or Firm*—Clark & Brody

(57) ABSTRACT

A method of growing silicon single crystals with a [110] crystallographic axis orientation by the Czochralski method is provided according to which a silicon seed crystal doped with a high concentration of boron is used and an included angle of a conical part during shoulder section formation is maintained within a specified range. It is thereby possible to grow large-diameter and heavy-weight dislocation-free silicon single crystals with a diameter of 300 mm or more in a stable manner, without the fear of dropping the single crystal during pulling up. Therefore, the method can be properly utilized in producing silicon single crystals as semiconductor materials.

4 Claims, 1 Drawing Sheet

METHOD FOR PRODUCING SILICON SINGLE CRYSTAL

BACKGROUND OF THE INVENTION

1. Field of the Invention

The present invention relates to a method of producing dislocation-free silicon single crystals with a [110] crystallographic axis orientation by the Czochralski method (hereinafter referred to as CZ method).

2. Description of the Related Art

During growing a silicon single crystal by the CZ method, the heat shock incurred when a silicon seed crystal is brought into contact with silicon melt causes dislocations to occur within the silicon seed crystal. The dislocations thus generated in those silicon single crystals with a [100] crystallographic axis orientation which are in general and frequent use can be made to disappear in the necking process.

However, from the viewpoint of crystal structure, a silicon single crystal with a [110] crystallographic axis orientation has a [111] plane which is a slip plane parallel to the axial pull-up direction, and the dislocations generated in the silicon seed crystal upon contacting with the silicon melt hardly run out of the silicon seed crystal in the necking process. Therefore, the dislocations are carried over to the grown crystal via a neck section, causing the problem that no dislocation-free silicon single crystals can be grown.

In addition, for producing silicon single crystal ingots larger in diameter and heavier in weight, it is necessary to increase the neck diameter and, from this point of view as well, it has become increasingly difficult to remove dislocations.

Various technologies have so far been developed and proposed for rendering silicon single crystals grown by the CZ method free of dislocations. Among them, Japanese Patent No. 3,726,847 discloses a method of producing silicon single crystals by the CZ method according to which, to cope with the increases in the diameter and weight of silicon single crystals, use is made of a silicon seed crystal having a boron concentration of not less than $2.7 \times 10^{17}$ atoms/cm$^3$ and not more than $1.4 \times 10^{19}$ atoms/cm$^3$, the melt with the high concentration of boron added likewise is used as silicon melt and a neck section diameter of 5-8 mm is employed.

It is alleged that, according to this method, the dislocations generated at the time of contact of the silicon seed crystal with the silicon melt are immobilized and prevented from propagating by the high-concentration dopant in the silicon seed crystal and, thus, the neck section can be rendered dislocation-free even when the neck section diameter is increased and, with the result that the neck section strength is improved to thereby make it possible to pull up a large-diameter, heavyweight silicon single crystal.

Japanese Patent Application Publication No. 09-249492 describes a method of pulling up silicon single crystals using silicon seed crystals having a boron concentration within the range of from $5 \times 10^{19}$ to $6 \times 10^{20}$ atoms/cm$^3$. The high concentration of boron increases the stress level required for the dislocations generated upon contact of the silicon seed crystal with the melt to propagate towards the upper part of the silicon seed crystal as compared with the ordinary boron concentration, whereby the dislocations can be inhibited from propagating. Accordingly, when the portion where the dislocations have been introduced can be removed by dissolving the same in the melt and, allegedly, it becomes possible to pull up a single crystal on the basis of the resulting dislocation-free silicon seed crystal.

Further, Japanese Patent Application Publication No. 04-139092 discloses a method of producing silicon single crystals using silicon seed crystals containing at least $1 \times 10^{19}$ atoms/cm$^3$ of boron to thereby increase the yield strength of the silicon seed crystal to a level not less than the thermal stress acting at the moment of contact of the silicon seed crystal with the silicon melt and thus reduce the extent of dislocations in the silicon seed crystal.

The methods described in those documents, namely Japanese Patent No. 3,726,847, Japanese Patent Application Publication No. 09-249492 and Japanese Patent Application Publication No. 04-139092, all consist in adding a high concentration of boron to a silicon seed crystal to inhibit the propagation of dislocations or the formation of dislocations and thereby render the silicon seed crystal dislocation-free or inhibit the propagation of dislocations, and thus allow a dislocation-free single crystal to grow from the resulting seed crystal surface.

However, when attempts were made to grow dislocation-free silicon single crystals with a diameter of 300 mm and a [110] crystallographic axis orientation using silicon seed crystals doped with a high concentration of boron, it was not always possible to pull up dislocation-free silicon single crystals in good yield and in a stable manner, without dropping or the fear of dropping.

On the other hand, Japanese Patent No. 3,555,081 describes a method of producing silicon single crystals doped with arsenic or antimony and having a crystal conical part (corresponding to a transitional region from the neck section to the cylindrical crystal) with a subtended/included angle of 40°-60°. However, the dislocation-free single crystals obtainable by this method are the ones with a (100) surface orientation and the included angle cannot be said to be large; thus, the method has drawbacks that a long period of time is required for the formation of the conical part and the productivity is thus low.

SUMMARY OF THE INVENTION

It is an object of the present invention to solve the problems mentioned above and provide a method of producing silicon single crystals by which dislocation-free silicon single crystals with a [110] crystallographic axis orientation can be grown in good yield and in a stable manner, without dropping the single crystal during growing or the fear of such dropping.

The present inventors made investigations to accomplish the above object and, in the course thereof, found that the shoulder section formation after rendering the neck section dislocation-free is important in pulling up crystals with a crystallographic axis orientation of [110], as described below.

Repetitions of shoulder section growth experiments gave the following results. When silicon seed crystals having an ordinary boron concentration level (about $1 \times 10^{15}$ atoms/cm$^3$) are used, dislocations often occur therein if the ratio of increase in diameter to crystal pull-up length is in excess of 3 (112° in terms of an included angle of the conical part which will be described later herein). Further, by increasing the boron concentration in the silicon seed crystal, it becomes possible to increase the ratio of increase in diameter to crystal pull-up length (the included angle of the conical part) at which the dislocation-free conditions can be maintained. Thereby, the time required for the growth of the shoulder section can be reduced and the length of the desired cylindrical portion can be increased, which can greatly contribute to productivity enhancement.

FIG. 1 is an exemplary graphic representation of the relations between the pull-up length and the crystal diameter for the case of pulling up single crystals with a [110] crystallographic axis orientation and a cylindrical portion diameter of 300 mm. The abscissa denotes the crystal pull-up length from the lowest end of the neck section and the ordinate denotes the diameter (at the conical part) of the crystal pulled up. In this example, the boron concentration in the silicon seed crystals was $2 \times 10^{19}$ atoms/cm$^3$.

In FIG. 1, the relation shown by the curve (a) is for the case where the ratio of diameter increase to crystal pull-up length was 3.8 (125° in terms of the included angle of the conical part forming the shoulder section). When the pulling up of the crystal was carried out under this condition, dislocations occurred during growing the shoulder section. On the other hand, the relation shown by the curve (b) is for the case where the diameter increase ratio was 1.6 (77°, supra); the shoulder section could be formed without causing dislocations.

The present invention has been completed based on the above findings and the gist thereof consists in a method of producing silicon single crystals as described below.

Thus, the invention provides a method of producing silicon single crystals by the CZ method using silicon seed crystals to thereby grow silicon single crystals with a [110] crystallographic axis orientation, wherein:

the silicon seed crystals have a boron concentration of not less than $1.7 \times 10^{19}$ atoms/cm$^3$; and a shoulder section is formed so that a subtended/included angle of a conical part formed from the terminus of the neck section of the silicon single crystal towards the shoulder section may amount to 120°-50°.

The "included angle (θ) of the conical part" is twice the angle (θ/2) between a generating line 4 of a conical part 3 and a pull-up axis (shown by the broken line C in FIG. 2), the conical part 3 being formed from the terminus of a neck section 1 towards a shoulder section 2, the neck section 1 being formed successively below the lower end face of the silicon seed crystal. Thus, the included angle means the sum (θ) of the above-mentioned angle (θ/2) between the generating line of the conical part and the pull-up axis and the other angle (θ/2) in a relation of line symmetry relative to the pull-up axis.

In carrying out the production method according to the present invention, it is preferable that the above-defined included angle of the conical part is within the range of 115-60°. By slightly narrowing the range for the included angle (θ) of the conical part, it becomes possible to make it more difficult for dislocations to occur and, by increasing the lower limit to some extent, it becomes possible to increase the productivity.

In carrying out the production method according to the present invention, by setting a neck section diameter during growing to be 5-10 mm, which is larger than the neck section diameter conventionally applied (about 5-6 mm), it becomes possible to pull up the desired crystals in a stable manner, without the fear of dropping the crystals during pulling up.

According to the method of producing silicon single crystals of the invention, it is possible to grow large-diameter and heavy-weight dislocation-free silicon single crystals with a [110] crystallographic axis orientation and with a diameter of 300 mm or more in a stable manner, without the fear of dropping the single crystals during pulling up.

DETAILED DESCRIPTION OF THE PREFERRED EMBODIMENTS

Figure 1:
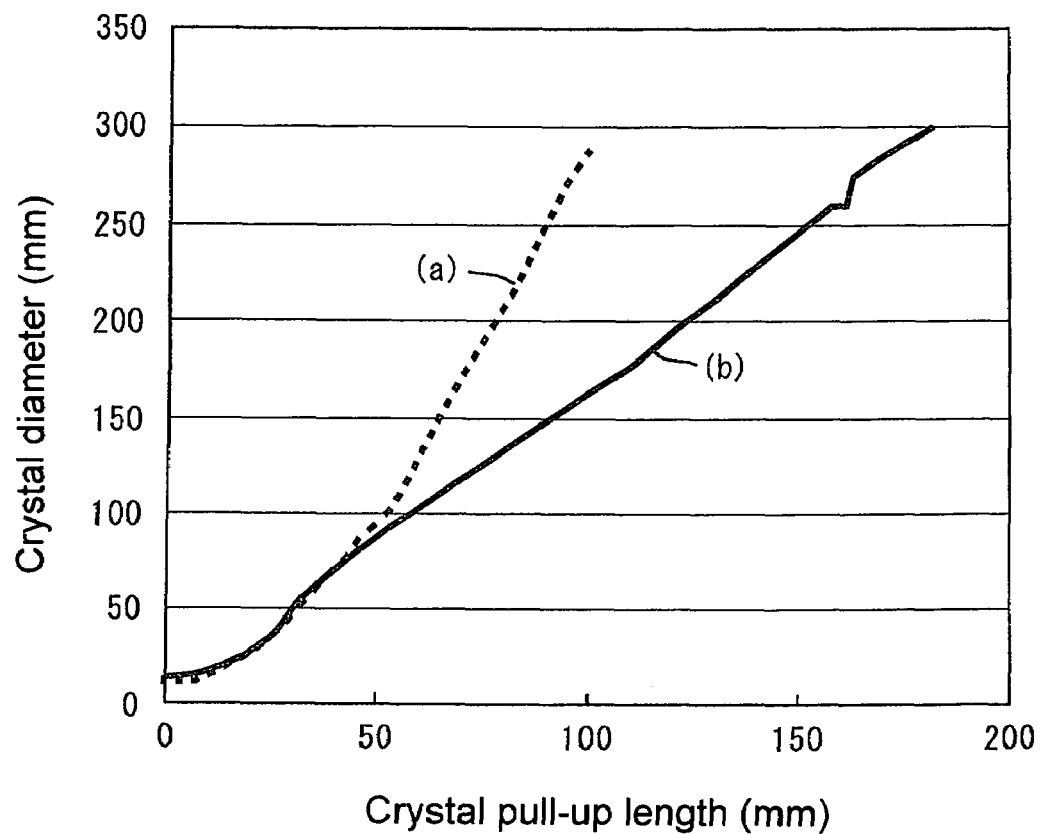
FIG. 1 is an exemplary graphic representation of the relations between the pull-up length and the crystal diameter for the case of pulling up single crystals with a [110] crystallographic axis orientation and a cylindrical portion diameter of 300 mm.
Figure 2:
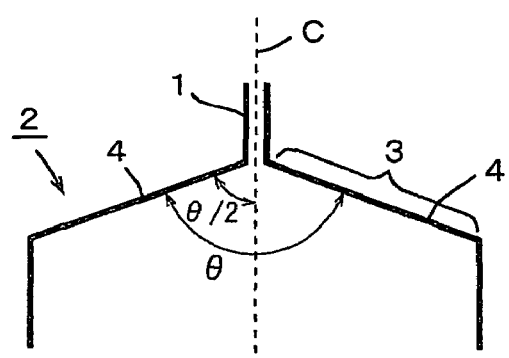
FIG. 2 is an explanatory drawing illustrating an included angle (θ) of the conical part formed from the terminus of the neck section towards the shoulder section.

The method of producing silicon single crystals according to the present invention is characterized in that, in growing a silicon single crystal by the CZ method, a silicon single crystal with a [110] crystallographic axis orientation is grown, a silicon seed crystal having a boron concentration of not less than $1.7 \times 10^{19}$ atoms/cm$^3$ is used and a shoulder section is formed so that an included angle (θ) of a conical part formed from the terminus of a neck section towards the shoulder section may amount to 120-50°.

A silicon single crystal with a [110] crystal orientation is targeted for growing because in prior art, the single crystal has a [111] plane which is a slip plane parallel to the axial pull-up direction, as already mentioned hereinabove, so that the dislocations generated upon contacting with the silicon melt hardly runs out of the silicon seed crystal in the necking process, hence a dislocation-free silicon single crystal can hardly be grown in a stable manner.

A seed crystal having a boron concentration of not less than $1.7 \times 10^{19}$ atoms/cm$^3$ is used for the purpose of immobilizing the dislocations generated upon contact of the silicon seed crystal with the silicon melt by means of the high-concentration boron in the silicon seed crystal to thereby inhibit the dislocations from propagating and render the neck section dislocation-free.

Any upper limit to the boron concentration is not specified. Generally, a difference in boron concentration between the silicon seed crystal and silicon melt leads to a problematic tendency for misfit dislocations to occur within the silicon seed crystal at the time of contact of the seed crystal with the silicon melt due to the differences in lattice constants and, therefore, a silicon melt having nearly the same concentration of boron added as the boron concentration in the silicon seed crystal is used.

The boron concentration in the silicon single crystal grown from such melt becomes constant depending on the boron concentration in the melt and the resistivity of the silicon single crystal is determined thereby; the higher the boron concentration is, the lower the resistivity becomes. The lower limit to the resistivity is decided by the performance characteristics required for the silicon single crystal and, therefore, the upper limit to the boron concentration is inevitably determined thereby.

The included angle (θ) of the conical part formed from the terminus of the neck section towards the shoulder section should be 120°-50° in order to inhibit the occurrence of dislocations in growing a silicon single crystal with a [110] crystallographic axis orientation. When the ratio of diameter increase to crystal pull-up length is excessive and the above-defined included angle is in excess of 120°, a thermal stress to be induced on the shoulder section becomes excessive, with the result that the thermal stress exceeds the yield stress of silicon to thereby presumably cause dislocations.

When, conversely, the included angle is smaller than 50°, the time required for growing the shoulder section becomes too long, resulting in decreases in productivity in silicon single crystal manufacture.

It is preferable that the included angle is within the range of 115°-60°. This is for the purpose of making the occurrence of dislocations more difficult by slightly narrowing the range for the included angle (θ) of the conical part and for increasing the productivity by increasing the lower limit to some extent.

When, in carrying out the method of producing silicon single crystals according to the present invention, the neck section diameter during growing is set to 5-10 mm, stable pull-up becomes possible, without the fear of dropping or the like during pulling up the single crystal. As the neck section diameter conventionally employed in pulling up silicon single crystals having a cylindrical portion diameter of 300 mm is about 5-6 mm, such enables to afford a sufficient margin on the upper limit side for the diameter to thereby set it as large as possible. The neck section diameter to be employed may be properly determined taking into consideration the above-mentioned boron concentration in the silicon seed crystal and the included angle (θ) of the conical part formed towards the shoulder section.

The method of growing silicon single crystals according to the present invention is preferably applied for growing large-diameter single crystals with a cylindrical portion diameter of 300 mm or more. This is because when small-size crystals being smaller in diameter, for example 200 mm or less, a required suspending load is small, the neck section diameter can be made smaller than 5 mm and dislocation-free single crystals can be grown with ease, so that there is no great necessity to apply the growing method according to the present invention.

As mentioned hereinabove, the method of producing silicon single crystals according to the present invention is characterized in that, in growing a silicon single crystal with a [110] crystallographic axis orientation, a silicon seed crystal doped with a high concentration of boron is used and a shoulder section is formed so that an included angle of a conical part formed from the terminus of a neck section towards the shoulder section is selected within the specified range.

By specifying the boron concentration in the silicon seed crystal and, in addition, properly specifying the included angle of the conical part during shoulder section formation at the initial stage of pulling up, it becomes possible to produce dislocation-free silicon single crystals with a [110] crystallographic axis orientation.

According to this method, the silicon seed crystal is doped with boron at a level not less than $1.7 \times 10^{19}$ atoms/cm$^3$ (not more than 0.007 Ω·cm in resistivity) and, therefore, when the boron concentration in the silicon melt is adequately adjusted depending on the dopant level, it is possible to produce high-resistivity silicon single crystals.

Epitaxial wafers are mainly used as substrates for power semiconductor devices for use in power supply controlling and the like and, therefore, low-resistance silicon wafers capable of reducing power consumptions are employed for such purposes. The silicon single crystals produced by the method according to the present invention are expected to be utilized in such fields.

EXAMPLES

Silicon single crystals with a [110] crystal orientation, having a diameter of 300 mm and an intended cylindrical portion length of 1500 mm, were grown while varying the boron concentration in the silicon seed crystal used and the included angle (θ) of the conical part formed towards the shoulder section on the occasion of crystal pulling up. The single crystals thus obtained were checked for the presence or absence of dislocations.

The boron concentration in the neck section formed in each single crystal grown from the silicon melt at a given boron concentration was estimated from the segregation coefficient of boron, and the boron concentration in the silicon melt was determined so that the boron concentration in the neck section might be equal to the boron concentration in the silicon seed crystal used in pulling up. For each set of conditions, three silicon single crystals were pulled up.

The examination results are shown in Table 1. In Table 1, the symbol ○ designates the case where all the three silicon single crystals could be grown without dislocations, the symbol Δ designates the case where one or two silicon single crystals showed dislocations and the symbol x designates the case where all the single crystals showed dislocations.

The presence or absence of dislocations was judged based on the presence or absence of habit lines formed along the axial direction of each single crystal pulled up and, when it was judged that there were no dislocations, the silicon single crystal after pulling up was cut at the middle section along a plane perpendicular to the lengthwise direction of the crystal, the cut surface was mirror etched with a mixed solution composed of HF and HNO$_3$ (=1:5) to obtain specular finish, followed by Wright etching using the Wright solution. The thus-etched sample surface was visually observed under light illumination by means of a lamp with a condenser lens to check for the presence or absence of dislocations.

TABLE 1

| Test No. | Boron concentration in seed crystal (atoms/cm$^3$) | Included angle of conical part(°) | Neck section diameter (mm) | Evaluation | Remark |
|---|---|---|---|---|---|
| 1 | $2 \times 10^{19}$ | *149 | 5 | x | |
| 2 | $2 \times 10^{19}$ | *125 | 5 | Δ | |
| 3 | $2 \times 10^{19}$ | 116 | 5 | ○ | |
| 4 | $2 \times 10^{19}$ | 100 | 5 | ○ | |
| 5 | $2 \times 10^{19}$ | 77 | 5 | ○ | |
| 6 | $2 \times 10^{19}$ | 61 | 5 | ○ | |
| 7 | $2 \times 10^{19}$ | *40 | 5 | ○ | Reduced productivity |
| 8 | *$1 \times 10^{15}$ | 114 | 5 | x | |
| 9 | *$1 \times 10^{17}$ | 113 | 5 | x | |
| 10 | *$1 \times 10^{19}$ | 115 | 5 | x | |
| 11 | $2 \times 10^{19}$ | 116 | 5 | ○ | |
| 12 | $5 \times 10^{19}$ | 114 | 5 | ○ | |
| 13 | $5 \times 10^{19}$ | 115 | 10 | ○ | |
| 14 | $1 \times 10^{20}$ | 115 | 8 | ○ | |
| 15 | $1 \times 10^{22}$ | 113 | 8 | ○ | |

Note:
The symbol * indicates that the value is outside the relevant range defined according to the invention.

In Test Nos. 1-7 given in Table 1, silicon single crystals were grown by using silicon seed crystals having a constant boron concentration ($2 \times 10^{19}$ atoms/cm$^3$) within the range specified by the present invention and by varying the included angle of the conical part in shoulder section formation. In each of Test Nos. 3-6 in which the included angle was maintained within the range specified by the present invention, all the three single crystals could be grown without the occurrence of dislocations. In Test No. 7, dislocation-free crystals could be grown but the included angle was small, hence a prolonged period of time was required for shoulder section formation, thus posing a productivity problem.

In Test Nos. 8-15, silicon single crystals were grown by maintaining the included angle of the conical part at a constant level (targeted at 115°) within the range specified by the present invention in shoulder section formation while varying the boron concentration in the silicon seed crystal. In Test Nos. 11-15 in which the boron concentrations were within the range specified herein, dislocation-free single crystals could be grown. On that occasions, it could be confirmed that even when the neck section diameter is increased to 10 mm (Test No. 13), it is possible to inhibit the propagation of dislocations by the effect of the addition of a high concentration of boron and thus secure a dislocation-free condition in the neck section to enable stable crystal growth.

As explained hereinabove, the method of producing silicon single crystals according to the present invention is the one for growing silicon single crystals with a [110] crystallographic axis orientation by using silicon seed crystals doped with a high concentration of boron and maintaining the included angle of the conical part during shoulder section formation within the specified range. By this method, it becomes possible to grow large-diameter and heavy-weight dislocation-free silicon single crystals with a diameter of 300 mm or more in a stable manner, without the fear of dropping single crystals during pulling up.

Accordingly, the method according to the present invention can be properly utilized in producing silicon single crystals as semiconductor materials.

The invention claimed is:

1. A method for producing silicon single crystals, comprising growing silicon single crystals with a [110] crystallographic axis orientation by the Czochralski method using a silicon seed crystal, wherein:
    a boron concentration in the silicon seed crystal is not less than $1.7 \times 10^{19}$ atoms/cm$^3$; and
    a shoulder section is formed so that an included angle of a conical part formed from the terminus of a neck section towards the shoulder section is maintained in the range of 120°-50°.

2. The method for producing silicon single crystals according to claim 1, wherein the included angle of the conical part formed from the terminus of the neck section towards the shoulder section of the silicon single crystal is maintained in the range of 115°-60°.

3. The method for producing silicon single crystals according to claim 1, wherein the neck section diameter during growing is 5-10 mm.

4. The method for producing silicon single crystals according to claim 2, wherein the neck section diameter during growing is 5-10 mm.

* * * * *